United States Patent
Shaikh et al.

(10) Patent No.: US 9,875,890 B2
(45) Date of Patent: Jan. 23, 2018

(54) DEPOSITION OF METAL DIELECTRIC FILM FOR HARDMASKS

(71) Applicant: Lam Research Corporation, Fremont, CA (US)

(72) Inventors: Fayaz Shaikh, Portland, OR (US); Sirish Reddy, Hillsboro, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 260 days.

(21) Appl. No.: 14/666,953

(22) Filed: Mar. 24, 2015

(65) Prior Publication Data

US 2016/0284541 A1    Sep. 29, 2016

(51) Int. Cl.
H01L 21/02 (2006.01)
H01L 21/033 (2006.01)
H01J 37/32 (2006.01)
C23C 16/32 (2006.01)

(52) U.S. Cl.
CPC ........ *H01L 21/02274* (2013.01); *C23C 16/32* (2013.01); *H01J 37/32082* (2013.01); *H01J 37/32568* (2013.01); *H01L 21/02109* (2013.01); *H01L 21/02175* (2013.01); *H01L 21/02183* (2013.01); *H01L 21/0332* (2013.01); *H01L 21/0337* (2013.01); *H01J 2237/3321* (2013.01)

(58) Field of Classification Search
CPC ........ H01L 21/02274; H01L 21/02109; H01L 21/02183; H01L 21/02175; H01L 21/0337; H01L 21/0332; C23C 16/32; H01J 37/32082; H01J 37/32568; H01J 2237/3321

See application file for complete search history.

(56) References Cited

U.S. PATENT DOCUMENTS

| | | | |
|---|---|---|---|
| 8,673,778 B2 | 3/2014 | Satoh | |
| 8,696,921 B2 | 4/2014 | Park et al. | |
| 2003/0082296 A1* | 5/2003 | Elers | C23C 16/34 174/256 |
| 2006/0240187 A1* | 10/2006 | Weidman | C23C 16/0272 427/248.1 |
| 2009/0280267 A1* | 11/2009 | Li | C23C 16/32 427/535 |
| 2011/0076390 A1* | 3/2011 | Cerio, Jr. | C23C 18/161 427/96.8 |
| 2012/0241412 A1* | 9/2012 | Murakami | B08B 7/0035 216/67 |
| 2015/0170882 A1* | 6/2015 | Yamawaku | H01J 37/32137 438/710 |

OTHER PUBLICATIONS

Zheng, Huang, Wang, Ma; "Preparation of Nano-crystalline Tungsten Carbide Thin Film Electrode and its Electrocatalytic Activity for Hydrogen Evolution"; Jun. 10, 2005; p. 1045-1049.

\* cited by examiner

Primary Examiner — Selim Ahmed

(57) ABSTRACT

A system and method for depositing a metal dielectric film includes arranging a substrate in a plasma enhanced chemical vapor deposition (PECVD) processing chamber; supplying a carrier gas to the PECVD processing chamber; supplying a dielectric precursor gas to the PECVD processing chamber; supplying a metal precursor gas to the PECVD processing chamber; creating plasma in the PECVD processing chamber; and depositing a metal dielectric film on the substrate at a process temperature that is less than 500° C.

27 Claims, 3 Drawing Sheets

DEPOSITION OF METAL DIELECTRIC FILM FOR HARDMASKS

FIELD

The present disclosure relates to substrate processing systems and methods, and more particularly to systems and methods for depositing hardmasks on substrates.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems for performing deposition and/or etching include a processing chamber with a pedestal. A substrate such as a semiconductor wafer may be arranged on the pedestal. For example in a chemical vapor deposition (CVD) process, a gas mixture including one or more precursors may be introduced into the processing chamber to deposit film on the substrate or to etch the substrate. In some substrate processing systems, plasma may be used to activate chemical reactions and is referred to herein as plasma enhanced CVD (PECVD).

Amorphous carbon and silicon films may be used as hardmasks for etching high aspect ratio features during substrate processing. For example in 3D memory applications, the hardmask film should be highly etch selective. As a result, the hardmask film should have higher modulus, denser, and more etch-chemistry-resistive bonding matrices. A balance is struck between being able to remove the hardmask film during an opening process and having high selectivity to the dielectric etching processes.

Tungsten carbide film is crystalline and is considered to be a hard coating. Tungsten carbide can act as a good hardmask film. However, tungsten carbide film is typically difficult to remove. Tungsten carbide film is usually deposited using deposition methods other than PECVD. While tungsten carbide film has been deposited using PECVD, very high process temperatures (approximately 800° C.) are used. For example, see "Plasma Enhanced Chemical Vapor Deposition Nanocrystalline Tungsten Carbide Thin Film and Its Electro-catalytic Activity", H. Zheng et. al., Journal of Material Science Technologies, Vol. 21, No. 4 2005, pp 545-548. The higher processing temperatures used in PECVD are often unsuitable for many applications.

SUMMARY

A method for depositing a metal dielectric film on a substrate includes arranging the substrate in a plasma enhanced chemical vapor deposition (PECVD) processing chamber; supplying a carrier gas to the PECVD processing chamber; supplying a dielectric precursor gas to the PECVD processing chamber; supplying a metal precursor gas to the PECVD processing chamber; creating plasma in the PECVD processing chamber; and depositing a metal dielectric film on the substrate at a process temperature that is less than 500° C.

In other features, the metal precursor gas is selected from a group consisting of titanium precursor gas, tantalum precursor gas, tungsten precursor gas, and vanadium precursor gas.

In other features, the metal precursor gas comprises tungsten precursor gas. The tungsten precursor gas comprises $WF_a$, where a is an integer greater than or equal to one. The tungsten precursor gas comprises bis(tert-butylimido)-bis-(dimethylamido)tungsten (BTBMW). The carrier gas is selected from a group consisting of molecular hydrogen ($H_2$), argon (Ar), molecular nitrogen ($N_2$), helium (He), and/or combinations thereof.

In other features, the dielectric precursor gas comprises hydrocarbon precursor gas. The hydrocarbon precursor gas comprises $C_xH_y$, wherein x is an integer from 2 to 10 and y is an integer from 2 to 24. The dielectric precursor gas comprises a nitride-based precursor gas. The hydrocarbon precursor gas is selected from a group consisting of methane, acetylene, ethylene, propylene, butane, cyclohexane, benzene and toluene. The metal dielectric film is nanocrystalline.

In other features, the PECVD processing chamber includes a first electrode arranged in a spaced relationship from a pedestal. The pedestal includes a second electrode. RF power from a plasma generator is supplied to the second electrode and the first electrode is grounded.

In other features, the first electrode includes a showerhead. A partial fraction of the metal precursor gas to the dielectric precursor gas is greater than 20%.

A method for depositing a metal dielectric film includes arranging a substrate in a plasma enhanced chemical vapor deposition (PECVD) processing chamber; supplying a carrier gas to the PECVD processing chamber; supplying a dielectric precursor gas to the PECVD processing chamber; supplying a metal precursor gas to the PECVD processing chamber; creating plasma in the PECVD processing chamber; and depositing a metal dielectric film on the substrate. The PECVD processing chamber includes a first electrode arranged in a spaced relationship from a pedestal. The pedestal includes a second electrode. RF power from a plasma generator is supplied to the second electrode and the first electrode is grounded.

In other features, the metal precursor gas is selected from a group consisting of titanium precursor gas, tantalum precursor gas, tungsten precursor gas, and vanadium precursor gas.

In other features, the metal precursor gas comprises tungsten precursor gas. The tungsten precursor gas comprises $WF_a$, where a is an integer greater than or equal to one. The tungsten precursor gas comprises bis(tert-butylimido)-bis-(dimethylamido)tungsten (BTBMW). The carrier gas is selected from a group consisting of molecular hydrogen ($H_2$), argon (Ar), molecular nitrogen ($N_2$), helium (He), and/or combinations thereof.

In other features, the dielectric precursor gas comprises hydrocarbon precursor gas. The hydrocarbon precursor gas comprises $C_xH_y$, wherein x is an integer from 2 to 10 and y is an integer from 2 to 24. The hydrocarbon precursor gas is selected from a group consisting of methane, acetylene, ethylene, propylene, butane, cyclohexane, benzene and toluene.

In other features, the dielectric precursor gas comprises nitride-based precursor gas. The metal dielectric film is nanocrystalline.

In other features, the first electrode includes a showerhead. A partial fraction of the metal precursor gas to the dielectric precursor gas is greater than 20%.

A substrate processing system for depositing a metal dielectric film includes a plasma enhanced chemical vapor deposition (PECVD) processing chamber including a pedestal. A gas delivery system is configured to selectively supply at least one of a carrier gas, a dielectric precursor gas and a metal precursor gas. A plasma generator is configured to selectively create plasma in the PECVD processing chamber. A controller is configured to communicate with the gas delivery system and the plasma generator and is further configured to: supply the carrier gas, the dielectric precursor gas and the metal precursor gas to the PECVD processing chamber; strike plasma in the PECVD processing chamber; and deposit a metal dielectric film on the substrate at a process temperature that is less than 500° C.

A substrate processing system for depositing a metal dielectric film includes a plasma enhanced chemical vapor deposition (PECVD) processing chamber including a pedestal. A first electrode is arranged in a spaced relationship from the pedestal. The pedestal includes a second electrode. The first electrode is grounded. A gas delivery system is configured to selectively supply at least one of a carrier gas, a dielectric precursor gas and a metal precursor gas to the PECVD processing chamber. A plasma generator is configured to selectively create plasma in the PECVD processing chamber by supplying RF power to the second electrode. A controller is configured to communicate with the gas delivery system and the plasma generator and is further configured to: supply the carrier gas, the dielectric precursor gas and the metal precursor gas to the PECVD processing chamber; strike the plasma in the PECVD processing chamber; and deposit a metal dielectric film on the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure are used to deposit metal dielectric film in a PECVD substrate processing chamber at process temperatures less than 500° C. In some examples, the dielectric film can be carbon-based or nitride-based. In some examples, the metal can be tungsten, titanium, tantalum or vanadium.

For example only, the dielectric film may be tungsten carbide. Due to the nanocrystalline structure and abundant concentration of dense carbon in the film, the tungsten carbide film can be used as an etch-selective hardmask film for dielectric etch chemistries.

The metal dielectric film is deposited in a PECVD substrate processing chamber. In some examples, the metal dielectric film is deposited using PECVD at process temperatures less than 500° C. In some examples, the metal dielectric film is deposited using PECVD at process temperatures between 400° C. and 500° C. These process temperatures enable the use of the metal dielectric film for new applications.

While portions of the foregoing description relate to deposition of tungsten carbide film, the present disclosure applies to other metal dielectric films such as but not limited to titanium carbide (TiC), tantalum carbide (TaC), tantalum nitride (TaN), vanadium carbide (VC), etc.

In some examples, the process gas includes a dielectric precursor gas. In some examples, the dielectric precursor gas includes a tungsten precursor gas such as $WF_a$ (where a is an integer greater than zero), bis(tert-butylimido)-bis-(dimethylamido)tungsten (BTBMW) precursor or other suitable tungsten precursors. In some examples, the tungsten precursor gas is tungsten hexafluoride ($WF_6$).

In some examples, the process gas further includes a hydrocarbon precursor gas such as $C_xH_y$, wherein x is an integer from 2 to 10 and y is an integer from 2 to 24. In some examples, the hydrocarbon precursor gas may include methane, acetylene, ethylene, propylene, butane, cyclohexane, benzene or toluene.

In some examples, the tungsten precursor gas is mixed in the PECVD deposition reactor with the hydrocarbon precursor gas and one or more carrier gases. In some examples, the carrier gases include molecular hydrogen ($H_2$), argon (Ar), molecular nitrogen ($N_2$), helium (He) or mixtures thereof.

The tungsten carbide film that is deposited has a nano-sized crystalline structure and provides sufficient etch selectivity. The tungsten carbide film can also be easily removed. Therefore, the tungsten carbide film is a very good candidate for hardmasks in applications requiring a lower process temperature ceiling.

In other examples, a nitride-based precursor gas and/or other metal-based precursor gas may be used.

Figure 1:
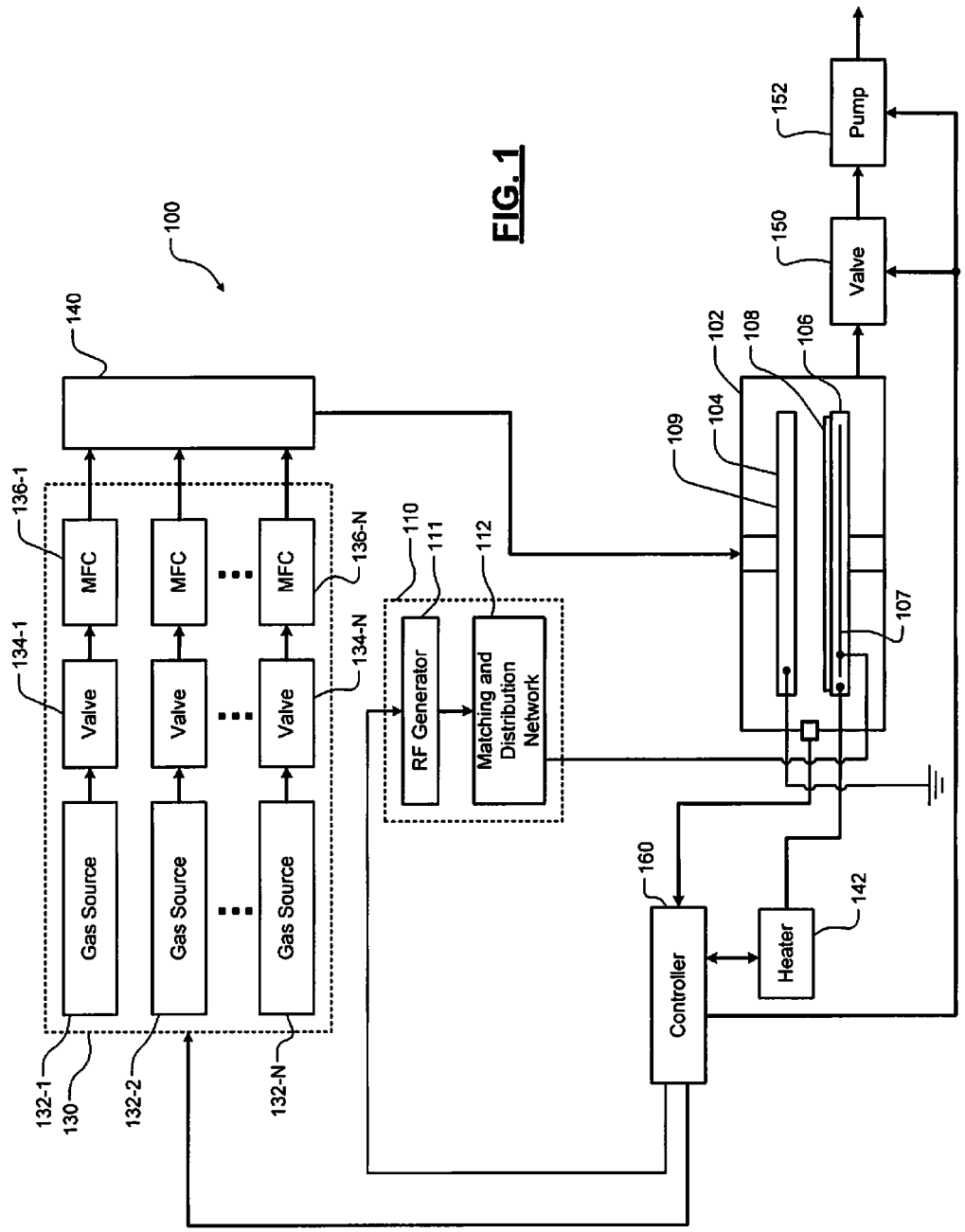
FIG. 1 is a functional block diagram illustrating an example of a PECVD substrate processing chamber for depositing a metal dielectric film such as tungsten carbide film at temperatures less than 500° C.

Referring now to FIG. 1, an example of a substrate processing system 100 for performing PECVD deposition of a metal dielectric film is shown. The substrate processing system 100 includes a processing chamber 102 that encloses other components of the substrate processing system 100 and contains the RF plasma. The substrate processing system 100 includes an upper electrode 104 and a pedestal 106 including a lower electrode 107. A substrate 108 is arranged on the pedestal 106 between the upper electrode 104 and the lower electrode 107.

For example only, the upper electrode 104 may include a showerhead 109 that introduces and distributes process gases. Alternately, the upper electrode 104 may include a conducting plate and the process gases may be introduced in another manner. The lower electrode 107 may be arranged in a non-conductive pedestal. Alternately, the pedestal 106 may include an electrostatic chuck that includes a conductive plate that acts as the lower electrode 107.

An RF generating system 110 generates and outputs an RF power to one of the upper electrode and the lower electrode. The other one of the upper electrode and the lower electrode may be DC grounded, AC grounded or floating. For example only, the RF generating system 110 may include an RF voltage generator 111 that generates the RF power that is fed by a matching and distribution network 112 to the upper electrode 104 or the lower electrode 107. In some examples, the RF power is delivered to the lower electrode 107 and the upper electrode 104 is grounded as shown in FIG. 1.

An example of a gas delivery system 130 is shown in FIG. 1. A gas delivery system 130 includes one or more gas sources 132-1, 132-2, . . . , and 132-N (collectively gas sources 132), where N is an integer greater than zero. The gas sources supply one or more metal precursors, dielectric precursors, carrier gases and mixtures thereof. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A heater 142 may be connected to a heater coil (not shown) arranged in the pedestal 106 to heat the pedestal 106. The heater 142 may be used to control a temperature of the pedestal 106 and the substrate 108. A valve 150 and pump 152 may be used to evacuate reactants from the processing chamber 102. A controller 160 may be used to control various components of the substrate processing system 100. For example only, the controller 160 may be used to control flow of process, carrier and precursor gases, striking and extinguishing plasma, removal of reactants, monitoring of chamber parameters, etc.

Figure 2:
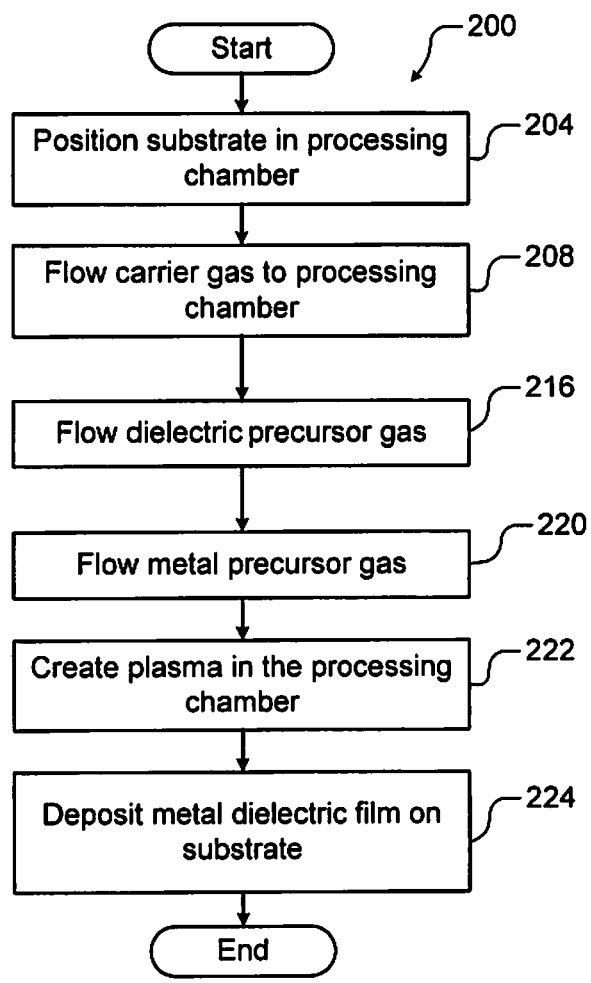
FIG. 2 is a flowchart illustrating an example of a method for depositing metal dielectric film according to the present disclosure.

Referring now to FIG. 2, a method 200 for depositing metal dielectric film according to the present disclosure is shown. At 204, a substrate is positioned in a PECVD processing chamber. At 208, carrier gas is supplied to the processing chamber. In some examples, the carrier gas may include molecular hydrogen ($H_2$), argon (Ar), molecular nitrogen ($N_2$), helium (He), and/or combinations thereof.

At 216, a dielectric precursor gas is supplied to the processing chamber. In some examples, the dielectric precursor gas includes nitride-based precursor or a hydrocarbon precursor gas. In some examples, the hydrocarbon precursor gas may include $C_xH_y$, wherein x is an integer from 2 to 10 and y is an integer from 2 to 24. In some examples, the hydrocarbon precursor gas may include methane, acetylene, ethylene, propylene, butane, cyclohexane, benzene or toluene.

At 220, a metal precursor gas is supplied to the processing chamber. In some examples, the metal precursor gas includes tungsten precursor gas, tantalum precursor gas, titanium precursor gas, vanadium precursor gas, etc. In some examples, the tungsten precursor gas includes $WF_a$ (where a is an integer greater than zero), bis(tert-butylimido)-bis-(dimethylamido)tungsten (BTBMW) precursor gas or other suitable tungsten precursor gases. At 222, plasma is created in the processing chamber. In some examples, RF power is supplied to the lower electrode and the upper electrode is grounded. At 224, metal dielectric film is deposited on the substrate. The metal dielectric film may be used as a hardmask during subsequent substrate processing. In some examples, the metal dielectric film includes tungsten carbide film, tantalum carbide film, tantalum nitride film, vanadium carbide film, etc.

Figure 3:
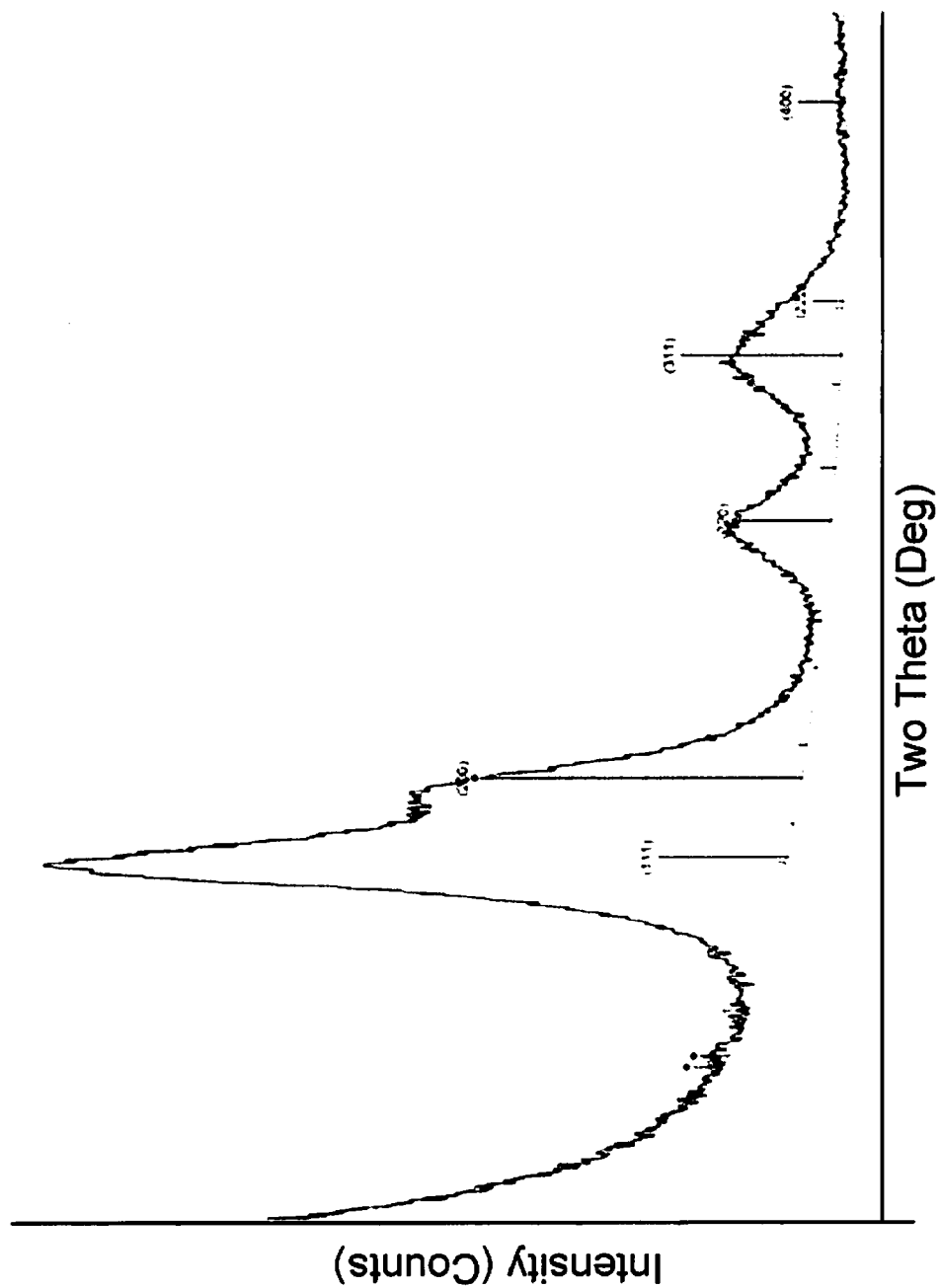
FIG. 3 is a graph illustrating intensity (counts) as a function of two theta (degrees) for an example tungsten carbide film deposited according to the present disclosure.

Referring now to FIG. 3, intensity (counts) are shown as a function of two theta (degrees). Tungsten carbide film has relatively small crystalline structure. In one example, the crystalline structure was 1.7 nm+/−0.2 nm with 100% crystallinity.

In some examples, the carrier gas is argon, the hydrocarbon precursor gas is $CH_4$ and the tungsten precursor gas is $WF_6$. In some examples, the partial fraction of the tungsten precursor gas to the hydrocarbon precursor gas is greater than 20%. In some examples, the partial fraction of $CH_4$ to $WF_6$ is greater than 20%. In some examples, the process pressure is between 3 Torr and 7 Torr. In some examples, the process pressure is between 4 Torr and 6 Torr. In some examples, the process pressure is 5 Torr.

In some examples, the high-frequency (HF) power is supplied a frequency of 13.56 MHz, although other frequencies may be used.

In some examples, the low-frequency (LF) power is supplied a frequency that is less than or equal to 800 kHz. In other examples, the low-frequency power is supplied at a frequency that is less than or equal to 600 kHz. In other examples, the low-frequency power is supplied at a frequency that is less than or equal to 500 kHz. In still other examples, the low-frequency power is supplied at a frequency of 400 kHz.

In some examples, the high-frequency radio frequency (RF) power is greater than the low-frequency RF power. In some examples, the high-frequency RF power is less than or equal to 2400 W. In other examples, the high-frequency RF power is less than or equal to 2200 W. In still other examples, the high-frequency RF power is 2000 W.

In some examples, the low-frequency (LF) RF power is less than or equal to 2000 W. In other examples, the low-frequency RF power at is less than or equal to 1800 W. In still other examples, the low-frequency RF power is 1600 W. In some examples, the low frequency RF power is about 20% less than the high frequency power.

The foregoing table sets forth one example of process parameters for depositing the tungsten carbide film:

| Process Parameter | Value |
| --- | --- |
| Temperature | 400° C.-500° C. |
| Pressure | 5 Torr |
| $WF_6$ | 225 sccm |
| $CH_4$ | 750 sccm |
| Ar | 5768 sccm |
| $H_2$ | 0 sccm |
| HF Power | 2000 W @ 13.56 MHz |
| LF Power | 1600 W @ 400 kHz |

Similar recipes may be used when depositing nitride-based film and/or other metals.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for depositing a tungsten carbide film on a substrate, comprising:
   arranging the substrate in a plasma enhanced chemical vapor deposition (PECVD) processing chamber;
   supplying a carrier gas to the PECVD processing chamber;
   supplying a dielectric precursor gas to the PECVD processing chamber;
   supplying a metal precursor gas to the PECVD processing chamber;
   creating plasma in the PECVD processing chamber; and
   depositing, using PECVD, a tungsten carbide film on the substrate at a process temperature that is less than 500° C.

2. The method of claim 1, wherein the metal precursor gas comprises tungsten precursor gas.

3. The method of claim 2, wherein the tungsten precursor gas comprises $WF_a$, where a is an integer greater than or equal to one.

4. The method of claim 2, wherein the tungsten precursor gas comprises bis(tert-butylimido)-bis-(dimethylamido) tungsten (BTBMW).

5. The method of claim 1, wherein the carrier gas is selected from a group consisting of molecular hydrogen ($H_2$), argon (Ar), molecular nitrogen ($N_2$), helium (He), and/or combinations thereof.

6. The method of claim 1, wherein the dielectric precursor gas comprises hydrocarbon precursor gas.

7. The method of claim 6, wherein the hydrocarbon precursor gas comprises $C_xH_y$, wherein x is an integer from 2 to 10 and y is an integer from 2 to 24.

8. The method of claim 1, wherein the dielectric precursor gas comprises nitride-based precursor gas.

9. The method of claim 6, wherein the hydrocarbon precursor gas is selected from a group consisting of methane, acetylene, ethylene, propylene, butane, cyclohexane, benzene and toluene.

10. The method of claim 1, wherein the tungsten carbide film is nanocrystalline.

11. The method of claim 1, wherein:
    the PECVD processing chamber includes a first electrode arranged in a spaced relationship from a pedestal;
    the pedestal includes a second electrode; and
    RF power from a plasma generator is supplied to the second electrode and the first electrode is grounded.

12. The method of claim 11, wherein the first electrode includes a showerhead.

13. The method of claim 1, wherein a partial fraction of the metal precursor gas to the dielectric precursor gas is greater than 20%.

14. A method for depositing a tungsten carbide film, comprising:
arranging a substrate in a plasma enhanced chemical vapor deposition (PECVD) processing chamber;
supplying a carrier gas to the PECVD processing chamber;
supplying a dielectric precursor gas to the PECVD processing chamber;
supplying a metal precursor gas to the PECVD processing chamber;
creating plasma in the PECVD processing chamber; and
depositing, using PECVD, a tungsten carbide film on the substrate,
wherein the PECVD processing chamber includes a first electrode arranged in a spaced relationship from a pedestal;
wherein the pedestal includes a second electrode; and
wherein RF power from a plasma generator is supplied to the second electrode and the first electrode is grounded.

15. The method of claim 14, wherein the metal precursor gas comprises tungsten precursor gas.

16. The method of claim 15, wherein the tungsten precursor gas comprises $WF_a$, where a is an integer greater than or equal to one.

17. The method of claim 15, wherein the tungsten precursor gas comprises bis(tert-butylimido)-bis-(dimethylamido)tungsten (BTBMW).

18. The method of claim 14, wherein the carrier gas is selected from a group consisting of molecular hydrogen ($H_2$), argon (Ar), molecular nitrogen ($N_2$), helium (He), and/or combinations thereof.

19. The method of claim 14, wherein the dielectric precursor gas comprises hydrocarbon precursor gas.

20. The method of claim 19, wherein the hydrocarbon precursor gas comprises $C_xH_y$, wherein x is an integer from 2 to 10 and y is an integer from 2 to 24.

21. The method of claim 14, wherein the dielectric precursor gas comprises nitride-based precursor gas.

22. The method of claim 20, wherein the hydrocarbon precursor gas is selected from a group consisting of methane, acetylene, ethylene, propylene, butane, cyclohexane, benzene and toluene.

23. The method of claim 14, wherein the tungsten carbide film is nanocrystalline.

24. The method of claim 14, wherein the first electrode includes a showerhead.

25. The method of claim 14, wherein a partial fraction of the metal precursor gas to the dielectric precursor gas is greater than 20%.

26. A substrate processing system for depositing a tungsten carbide film, comprising:
a plasma enhanced chemical vapor deposition (PECVD) processing chamber including a pedestal;
a gas delivery system configured to selectively supply at least one of a carrier gas, a dielectric precursor gas and a metal precursor gas;
a plasma generator configured to selectively create plasma in the PECVD processing chamber; and
a controller configured to communicate with the gas delivery system and the plasma generator and further configured to:
supply the carrier gas, the dielectric precursor gas and the metal precursor gas to the PECVD processing chamber;
strike plasma in the PECVD processing chamber; and
deposit, using PECVD, a tungsten carbide film on the substrate at a process temperature that is less than 500° C.

27. A substrate processing system for depositing a tungsten carbide film, comprising:
a plasma enhanced chemical vapor deposition (PECVD) processing chamber including a pedestal;
a first electrode arranged in a spaced relationship from the pedestal,
wherein the pedestal includes a second electrode, and
wherein the first electrode is grounded;
a gas delivery system configured to selectively supply at least one of a carrier gas, a dielectric precursor gas and a metal precursor gas to the PECVD processing chamber;
a plasma generator configured to selectively create plasma in the PECVD processing chamber by supplying RF power to the second electrode; and
a controller configured to communicate with the gas delivery system and the plasma generator and further configured to:
supply the carrier gas, the dielectric precursor gas and the metal precursor gas to the PECVD processing chamber;
strike the plasma in the PECVD processing chamber; and
deposit, using PECVD, a tungsten carbide film on the substrate.

* * * * *